(12) United States Patent
Lee

(10) Patent No.: US 11,101,250 B2
(45) Date of Patent: Aug. 24, 2021

(54) LIGHT-EMITTING DEVICE PACKAGE

(71) Applicant: SUZHOU LEKIN SEMICONDUCTOR CO., LTD., Seoul (KR)

(72) Inventor: Koh Eun Lee, Seoul (KR)

(73) Assignee: SUZHOU LEKIN SEMICONDUCTOR CO., LTD., Suzhou (CN)

( * ) Notice: Subject to any disclaimer, the term of this patent is extended or adjusted under 35 U.S.C. 154(b) by 0 days.

(21) Appl. No.: 16/423,359

(22) Filed: May 28, 2019

(65) Prior Publication Data

US 2019/0363071 A1 Nov. 28, 2019

(30) Foreign Application Priority Data

May 28, 2018 (KR) .................. 10-2018-0060494

(51) Int. Cl.
*H01L 25/07* (2006.01)
*H01L 25/075* (2006.01)
*H01L 25/16* (2006.01)

(52) U.S. Cl.
CPC ........ *H01L 25/0753* (2013.01); *H01L 25/165* (2013.01); *H01L 25/167* (2013.01)

(58) Field of Classification Search
CPC combination set(s) only.
See application file for complete search history.

(56) References Cited

U.S. PATENT DOCUMENTS

| 2010/0078669 A1* | 4/2010 | Cho | H01L 33/46 257/98 |
| 2013/0001599 A1* | 1/2013 | Lee | H01L 33/502 257/88 |

(Continued)

*Primary Examiner* — Moin M Rahman
(74) *Attorney, Agent, or Firm* — Birch, Stewart, Kolasch & Birch, LLP

(57) ABSTRACT

Disclosed herein is a light-emitting device package a body including a cavity; a first electrode disposed on a bottom surface of the cavity; a plurality of second electrodes disposed on the bottom surface of the cavity and configured to surround the first electrode; a first light-emitting device disposed on the first electrode; a second light-emitting device disposed on one among the plurality of second electrodes; and a light-transmitting member disposed on the body, wherein the bottom surface of the cavity includes a first edge extending in a first direction, a second edge configured to face the first edge and extend in the first direction, a third edge configured to extend in a second direction perpendicular to the first direction and connected to the first and second edges, and a fourth edge configured to face the third edge, extend in the second direction, and connected to the first and second edges; the first electrode includes an arrangement portion, on which the first light-emitting device is disposed, and an extension configured to extend from the arrangement portion to the third edge; the arrangement portion includes a first inclined surface, a second inclined surface configured to face the first inclined surface, a third inclined surface perpendicular to the first and second inclined surfaces, a fourth inclined surface configured to face the third inclined surface, a first corner at which the first inclined surface and the fourth inclined surface meet, a second corner at which the second inclined surface and the fourth inclined surface meet, and a third corner at which the second inclined surface and the third inclined surface meet; each of the first to fourth inclined surfaces has an angle greater than 0 degree or less than 90 degrees with (Continued)

respect to the first to fourth edges; and the plurality of second electrodes branch off by the first to third corners.

9 Claims, 8 Drawing Sheets

(56) References Cited

U.S. PATENT DOCUMENTS

| | | | |
|---|---|---|---|
| 2014/0306245 A1* | 10/2014 | Hayashi | H01L 33/58 |
| | | | 257/88 |
| 2016/0069525 A1* | 3/2016 | Chen | F21S 41/148 |
| | | | 362/612 |
| 2017/0213945 A1* | 7/2017 | Yamashita | H01L 33/62 |

* cited by examiner

LIGHT-EMITTING DEVICE PACKAGE

CROSS-REFERENCE TO RELATED APPLICATION(S)

This application claims priority under 35 U.S.C. § 119 to Korean Application No. 2018-0060494, filed on May 28, 2018, whose entire disclosure is hereby incorporated by reference.

BACKGROUND

1. Field

Exemplary embodiments relate to a light-emitting device package.

2. Background

Semiconductor devices including compounds, such as GaN, AlGaN, and the like, have many advantages, such as a wide and easily adjustable energy bandgap and the like, and can be variously used as light-emitting devices, light-receiving devices, various diodes, and the like.

Specifically, light-emitting devices, such as light-emitting diodes (LEDs) or laser diodes using a compound semiconductor material of a Group III-V or II-VI compound semiconductor, can implement various color lights such as red light, green light, blue light, and ultraviolet rays with development of a thin film growth technique and an element material, can also implement white light with high efficiency using a fluorescent material or combining colors, and has advantages of low power consumption, a semi-permanent lifetime, a fast response speed, safety, and environmental friendliness as compared to the conventional light sources such as fluorescent lamps and incandescent lamps.

In addition, when light receiving devices, such as photodetectors or solar cells, are manufactured using a Group III-V or II-VI compound semiconductor material, due to development of an element material, the light receiving element absorbs light of various wavelength regions to generate a photoelectric current so that light in various wavelength regions from gamma rays to a radio wavelength region may be used. Further, with advantages of the fast response speed, safety, environmental friendliness, and easy control of a device material, the light devices can also be easily used for power control, microwave circuits, or communication modules.

Accordingly, applications of the semiconductor devices have expanded to being applied as transmission modules of optical communication devices, LED backlights replacing cold cathode fluorescent lamps (CCFLs) which constitute backlights of liquid crystal display (LCD) devices, white LED lighting devices capable of replacing fluorescent lamps or incandescent lamps, headlights of vehicles, traffic lights, sensors for detecting a gas or fire, and the like. Further, application fields of semiconductor devices can be expanded to being applied to high frequency application circuits, other power control devices, and communication modules.

In particular, semiconductor devices emitting light in an ultraviolet wavelength range can be used for curing, a medical use, and sterilization by executing curing and sterilization.

Recently, research on ultraviolet light-emitting device packages has been actively carried out, but there is a problem in that visual inspection cannot determine whether ultraviolet light is emitted. Further, there is a limitation on a chip size in one package size.

SUMMARY OF THE INVENTION

The present invention is directed to a light-emitting device package capable of determining whether ultraviolet light is emitted by visual inspection.

The present invention is also directed to a light-emitting device package capable of being manufactured with a chip having a large size in one size package.

Problems to be solved in the embodiments are not limited to the above-described problems, and objects and effects which can be determined from the solutions and the embodiments of the problems described below are also included.

According to an aspect of the present invention, there is provided a light-emitting device package including a body including a cavity; a first electrode disposed on a bottom surface of the cavity; a plurality of second electrodes disposed on the bottom surface of the cavity and configured to surround the first electrode; a first light-emitting device disposed on the first electrode; a second light-emitting device disposed on one among the plurality of second electrodes; and a light-transmitting member disposed on the body, wherein the bottom surface of the cavity may include a first edge extending in a first direction, a second edge configured to face the first edge and extend in the first direction, a third edge configured to extend in a second direction perpendicular to the first direction and connected to the first and second edges, and a fourth edge configured to face the third edge, extend in the second direction, and connected to the first and second edges; the first electrode may include an arrangement portion, on which the first light-emitting device is disposed, and an extension configured to extend from the arrangement portion to the third edge; the arrangement portion may include a first inclined surface, a second inclined surface configured to face the first inclined surface, a third inclined surface perpendicular to the first and second inclined surfaces, a fourth inclined surface configured to face the third inclined surface, a first corner at which the first inclined surface and the fourth inclined surface meet, a second corner at which the second inclined surface and the fourth inclined surface meet, and a third corner at which the second inclined surface and the third inclined surface meet; each of the first to fourth inclined surfaces may have an angle greater than 0 degree or less than 90 degrees with respect to the first to fourth edges; and the plurality of second electrodes may branch off by the first to third corners.

The first light-emitting device may emit light having a peak wavelength in an ultraviolet light wavelength range.

The second light-emitting device may emit light having a peak wavelength in a visible light wavelength range.

The plurality of second electrodes may include a second-first electrode configured to face the first inclined surface and the extension and extend to the first edge, a second-second electrode configured to face the fourth inclined surface and extend to the first and fourth edges, a second-third electrode configured to face the second inclined surface and extend to the second and fourth edges, and a second-fourth electrode configured to face the third inclined surface and extend to the second and third edges.

The first corner may be disposed between the second-first electrode and the second-second electrode to be spaced apart from the first edge, the second corner may be disposed between the second-second electrode and the second-third electrode to be spaced apart from the fourth edge, and the third corner may be disposed between the second-third electrode and the second-fourth electrode to be spaced apart from the second edge.

The first corner may face a central portion of the first edge, the second corner may face a central portion of the fourth edge, and the third corner may face a central portion of the second edge.

The light-emitting device package may further include a protective element disposed on the extension.

The body may include a first sub-layer, a second sub-layer disposed on the first sub-layer and including the bottom surface of the cavity, and a fourth sub-layer disposed on the second sub-layer and including a side surface of the cavity.

The first and second light-emitting devices may be disposed on the second sub-layer.

The body may include a third-first sub-layer disposed on the second sub-layer, the first light-emitting device may be disposed on the second sub-layer, and the second light-emitting device may be disposed on the third-first sub-layer.

The body may include a third-second sub-layer disposed on the second sub-layer, the first light-emitting device may be disposed on the third-second sub-layer, and the second light-emitting device may be disposed on the second sub-layer.

The body may include a fifth sub-layer disposed on the fourth sub-layer and configured to constitute a stepped portion on which a light-transmitting member is disposed.

BRIEF DESCRIPTION OF THE DRAWINGS

The above and other objects, features and advantages of the present invention will become more apparent to those of ordinary skill in the art by describing exemplary embodiments thereof in detail with reference to the accompanying drawings, in which.

DETAILED DESCRIPTION

Exemplary embodiments may be modified in other forms or various embodiments may be combined with each other, and the scope of the present invention is not limited to each embodiment described below.

Although an item described in a specific embodiment is not described in another embodiment, unless otherwise described in another embodiment or as long as there is no contradictory description therein, the item may be understood as being related to another embodiment.

For example, when a feature for a configuration A is described in a specific embodiment and a feature for a configuration B is described in another embodiment, even when an embodiment in which the configuration A and the configuration B are combined is not explicitly described, unless otherwise described in another embodiment or as long as there is no contradictory explanation therein, it should be understood that they will fall within the scope of the present invention.

In the description of the embodiments, when an element is described as being formed "on" or "under" another element, the terms "on" or "under" includes the meaning of the two components bring in direct contact with each other (directly) and the meaning of one or more other components being disposed and formed between the two components (indirectly). Further, when an element is described as being formed "on" or "under" another element, the description may include the meaning of the element being formed in an upward direction of another element and formed in a downward direction of another element.

Hereinafter, exemplary embodiments of the present invention will be fully described in detail which are suitable for implementation by those skilled in the art to which the present invention pertains with reference to the accompanying drawings.

Figure 1:
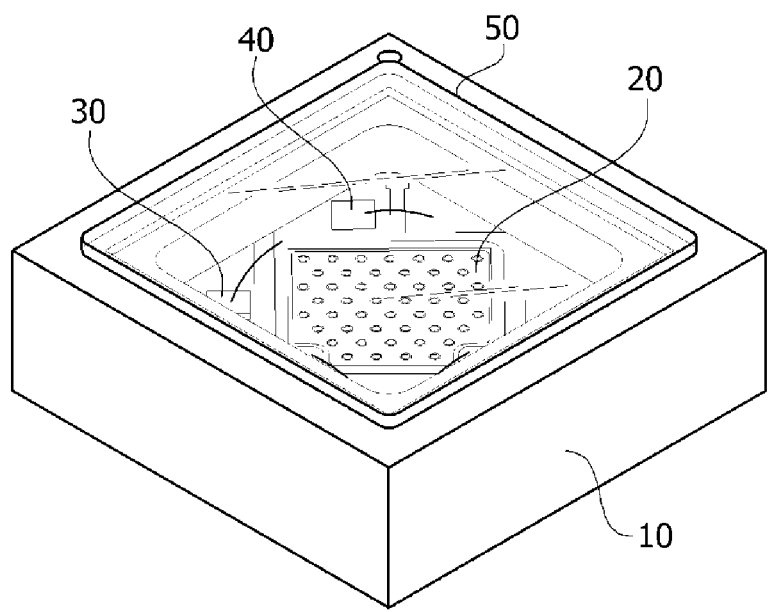
FIG. 1 is a perspective view of a light-emitting device package according to an exemplary embodiment of the present invention.
Figure 2:
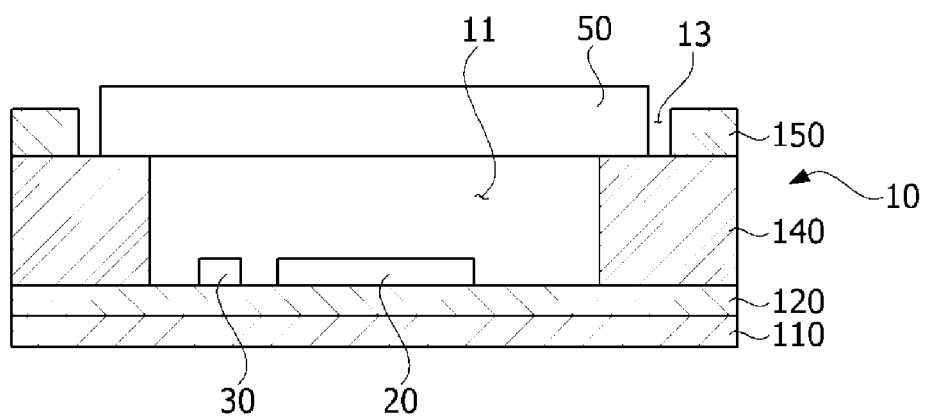
FIG. 2 is a cross-sectional view of FIG. 1.

FIG. 1 is a perspective view of a light-emitting device package according to an exemplary embodiment of the present invention, and FIG. 2 is a cross-sectional view of FIG. 1.

Referring to FIGS. 1 and 2, the light-emitting device package according to the exemplary embodiment of the present invention may include a body 10, a first light-emitting device 20, a second light-emitting device 30, a protective element 40, and a light-transmitting member 50.

The body 10 may include a cavity 11.

The cavity 11 may be filled with air. However, the present invention is not limited thereto, and the cavity 11 may be filled with various gases (e.g., nitrogen) other than air.

The body 10 may be made of a material which reflects ultraviolet light. However, the present invention is not limited thereto, and a coating layer (not shown) for reflecting ultraviolet light may be formed on a side surface of the cavity 11.

The body 10 may include a first sub-layer 110, a second sub-layer 120 disposed on the first sub-layer 110, a fourth sub-layer 140 disposed on the second sub-layer 120, and a fifth sub-layer 150 disposed on the fourth sub-layer 140.

The first sub-layer 110 and the second sub-layer 120 may be separate layers, but the present invention is not necessarily limited thereto, and the first sub-layer 110 and the second sub-layer 120 may be a single integrated layer.

The second sub-layer 120 may include a bottom surface of the cavity 11. The fourth sub-layer 140 may include the side surface of the cavity 11 and a bottom surface of a stepped portion 13. The fifth sub-layer 150 may include a side surface of the stepped portion 13. That is, the fifth sub-layer 150 may configure the stepped portion 13 on which the light-transmitting member 50 is disposed on the fourth sub-layer 140. However, the present invention is not necessarily limited thereto, the fifth sub-layer 150 may be omitted such that the stepped portion 13 may not be formed.

The plurality of sub-layers 110, 120, 140, and 150 may be fixed by an adhesive (not shown).

The plurality of sub-layers 110, 120, 140, and 150 may be made of the same material or different materials. For example, the plurality of sub-layers 110, 120, 140, and 150 may include a ceramic material such as AlN, but the present invention is not necessarily limited thereto.

A height from a lower surface of the first sub-layer 110 to an upper surface of the second sub-layer 120 may be in a range of 0.22 mm to 0.38 mm. A thickness of the first sub-layer 110 may be equal to that of the second sub-layer 120, but the present invention is not necessarily limited thereto. A thickness of the fourth sub-layer 140 may be in a range of 0.35 mm to 0.45 mm. A thickness of the fifth sub-layer 150 may be in a range of 0.15 mm to 0.25 mm. A height from the lower surface of the first sub-layer 110 to an upper surface of the fifth sub-layer 150 may be in a range of 0.81 mm to 0.99 mm.

The first light-emitting device 20 and the second light-emitting device 30 may be disposed on the second sub-layer 120.

The first light-emitting device 20 may emit light having a peak wavelength in an ultraviolet light wavelength range.

For example, the first light-emitting device 20 may emit near-ultraviolet light (UV-A) having a peak wavelength in a range of 320 nm to 420 nm. Alternatively, the first light-emitting device 20 may emit far-ultraviolet light (UV-B) having a peak wavelength in a range of 280 nm to 320 nm. Still alternatively, the first light-emitting device 20 may emit deep ultraviolet light (UV-C) having a peak wavelength in a range of 100 nm to 280 nm.

The second light-emitting device 30 may emit light having a peak wavelength in a visible light wavelength range.

For example, the second light-emitting device 30 may emit red light. Alternatively, the second light-emitting device 30 may emit green light, Still alternatively, the second light-emitting device 30 may emit blue light.

The first light-emitting device 20 and the second light-emitting device 30 may be configured to emit light simultaneously. That is, when the first light-emitting device 20 emits ultraviolet light, the second light-emitting device 30 may emit visible light. As a result, according to whether the second light-emitting device 30 emits visible light, visual inspection may determine whether the first light-emitting device 20 emits ultraviolet light.

The protective element 40 may be disposed on the bottom surface of the cavity 11. For example, the protective element 40 may include a Zener diode.

The light-transmitting member 50 may be disposed on the body 10. The light-transmitting member 50 may be inserted into the stepped portion 13. The light-transmitting member 50 may be fixed to the body 10 by an adhesive (not shown).

A material of the light-transmitting member 50 is not particularly limited as long as it can transmit light in the ultraviolet light wavelength range. For example, the material of the light-transmitting member 50 may include an optical material, such as quartz, having a high light transmittance in the ultraviolet light wavelength range.

Figure 3:
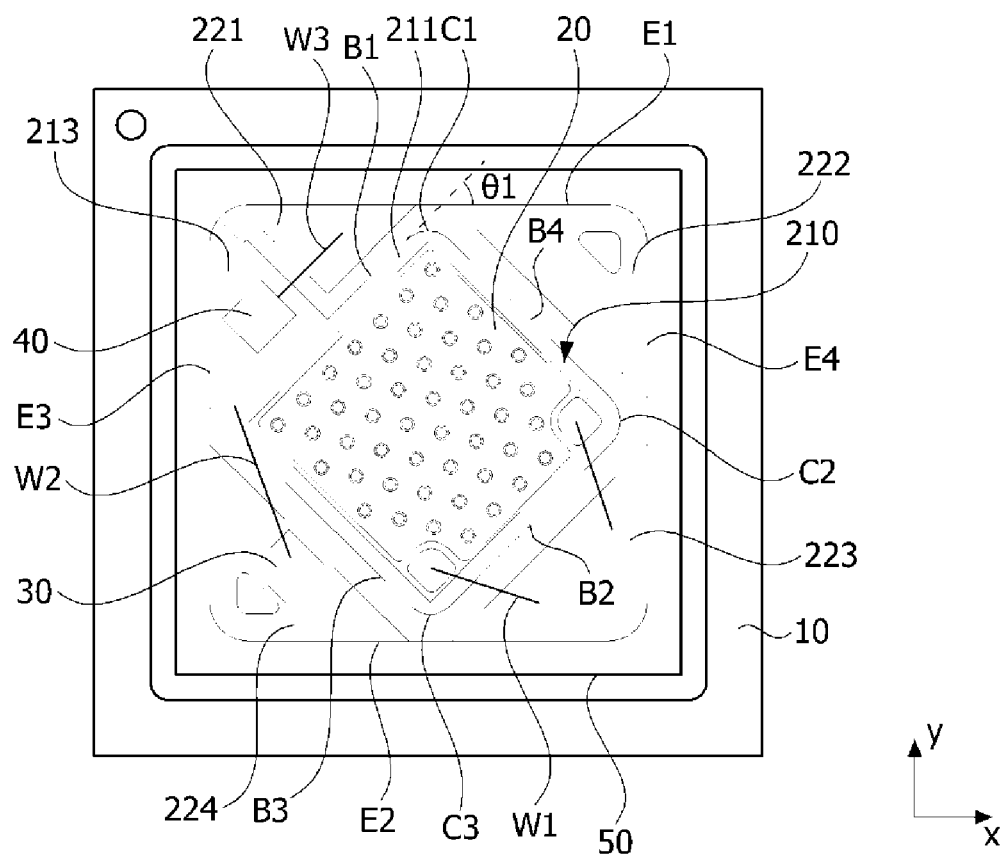
FIG. 3 is a plan view of FIG. 1.

FIG. 3 is a plan view of FIG. 1.

Referring to FIG. 3, the bottom surface of the cavity 11 of the body 10 may include a first edge E1 extending in a first direction (an X-axis direction), a second edge E2 facing the first edge E1 and extending in the first direction (the X-axis direction), a third edge E3 extending in a second direction (a Y-axis direction) perpendicular to the first direction and connected to the first edge E1 and the second edge E2, and a fourth edge E4 facing the first edge E3 extending in the second direction (the Y-axis direction) and connected to the first edge E1 and the second edge E2. The edges E1 to E4 may each refer to a line segment at which the bottom surface of the cavity 11 meets the side surface thereof.

A first electrode 210 and a plurality of second electrodes 221, 222, 223, and 224 may be disposed on the bottom surface of the cavity 11 of the body 10.

The first light-emitting device 20 may be disposed on the first electrode 210, and the second light-emitting device 30 may be disposed on any one among the plurality of second electrodes 221, 222, 223, and 224.

The first electrode 210 may include an arrangement portion 211, on which the first light-emitting device 20 is disposed, and an extension 213 extending from the arrangement portion 211 to the third edge E3. The protective element 40 may be disposed on the extension 213.

The arrangement portion 211 may include a first inclined surface B1, a second inclined surface B2 facing the first inclined surface B1, a third inclined surface B3 perpendicular to the first inclined surface B1 and the second inclined surface B2, a fourth inclined surface B4 facing the third inclined surface B3, a first corner C1 at which the first inclined surface B1 and the fourth inclined surface B4 meet, a second corner C2 at the second inclined surface B2 and the fourth inclined surface B4 meet, and a third corner C3 at which the second inclined surface B2 and the third inclined surface B3 meet. The arrangement portion 211 may have a rectangular shape, but the present invention is not necessarily limited thereto. The extension 213 may be connected to the first inclined surface B1 and the third inclined surface B3.

The first to fourth inclined surfaces B1, B2, B3, and B4 may have an angle greater than 0 degree or less than 90 degrees with respect to the first to fourth edges E1, E2, E3, and E4. For example, an angle θ1 between an extension line of the first inclined surface B1 and the first edge E1 may be greater than 30 degrees or less than 60 degrees. An angle between an extension line of the second inclined surface B2 and the second edge E2, an angle between an extension line of the third inclined surface B3 and the third edge E3, and an angle between an extension line of the fourth inclined surface B4 and the fourth edge E4 may each be equal to the angle θ1 between the extension line of the first inclined surface B1 and the first edge E1, but the present invention is not necessarily limited thereto, and these angles may each have an angle which is greater than 0 degree or less than 90 degrees and is difference from the angle θ1 between the extension line of the first inclined surface B1 and the first edge E1. That is, the arrangement portion 211 may be disposed to be rotated at a predetermined angle about the body 10. As a result, an area of the arrangement portion 211 increases such that a chip mounting area may increase in one size package. Therefore, a large-area chip may be mounted. Alternatively, the number of chips to be mounted may be increased.

The first corner C1 may be disposed to be spaced apart from the first edge E1, the second corner C2 may be disposed to be spaced apart from the fourth edge E4, and the third corner C3 may be disposed to be spaced apart from the second edge E2.

The first corner C1 may face a central portion of the first edge E1, the second corner C2 may face a central portion of the fourth edge E4, and the third corner C3 may face a central portion of the second edge E2.

The plurality of second electrodes 221, 222, 223, and 224 may surround the first electrode 210. That is, the plurality of second electrodes 221, 222, 223, and 224 may be disposed to surround the first electrode 210 along the first to fourth inclined surfaces B1, B2, B3, and B4 of the first electrode 210.

The plurality of second electrodes 221, 222, 223, and 224 may be spaced apart from each other. However, the present invention is not limited thereto, and the plurality of second electrodes 221, 222, 223, and 224 may be connected to each other.

The plurality of second electrodes 221, 222, 223, and 224 may include a second-first electrode 221, a second-second electrode 222, a second-third electrode 223, and a second-fourth electrode 224.

The second-first electrode 221 may be disposed to face the first inclined surface B1, and the extension 213 and may extend to the first edge E1. The second-second electrode 222 may be disposed to face the fourth inclined surface B4 and may extend to the first edge E1 and the fourth edge E4. The second-third electrode 223 may be disposed to face the second inclined surface B2 and may extend to the second edge E2 and the fourth edge E4. The second-fourth electrode 224 may be disposed to face the third inclined surface B3 and may extend to the second edge E2 and the third edge E3.

The plurality of second electrodes 221, 222, 223, and 224 may branch off by the first to third corners C1, C2, and C3. For example, the first corner C1 may be disposed between the second-first electrode 221 and the second-second electrode 222, the second corner C2 may be disposed between the second-second electrode 222 and the second-third electrode 223, and the third corner C3 may be disposed between the second-third electrode 223 and the second-fourth electrode 224.

The first light-emitting device 20 may be electrically connected to any one among the plurality of second electrodes 221, 222, 223, and 224 through a first wire W1. The second light-emitting device 30 may be electrically connected to the first electrode 210 through a second wire W2. The protective element 40 may be electrically connected to any one among the plurality of second electrodes 221, 222, 223, and 224 through a third wire W3.

Figure 4:
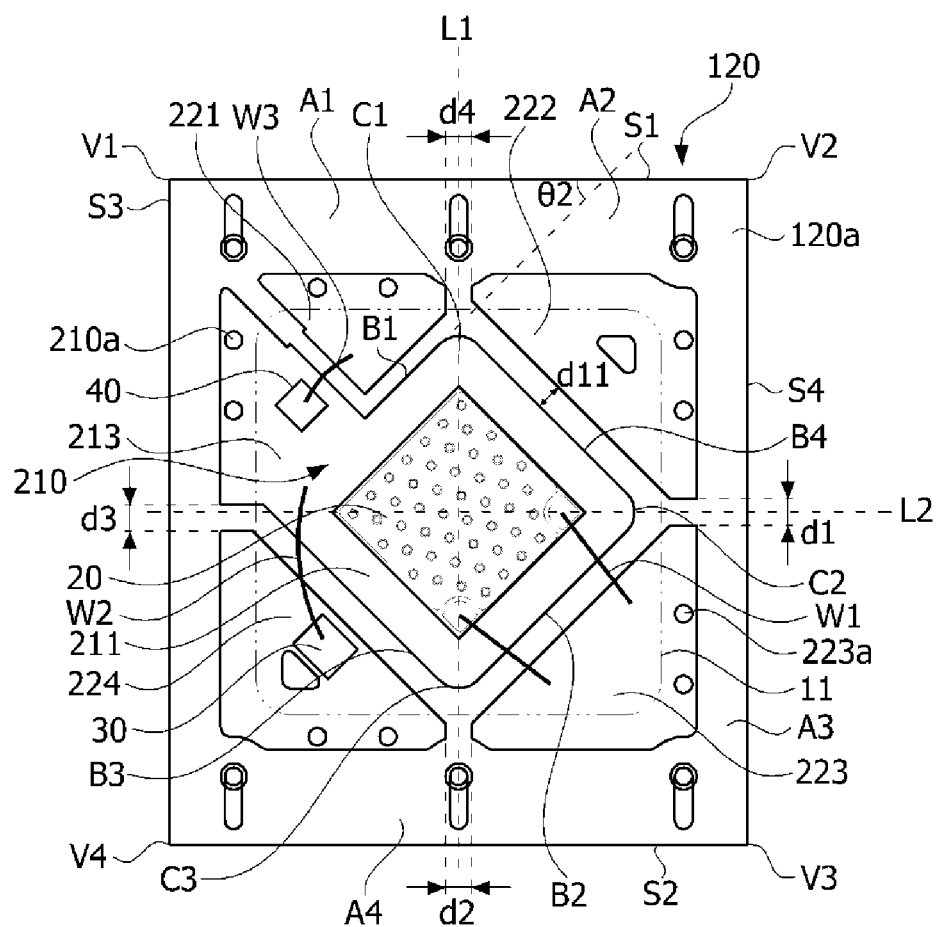
FIG. 4 is a diagram illustrating an electrode pattern layer.

FIG. 4 is a diagram illustrating an electrode pattern layer.

Referring to FIG. 4, the first electrode 210 and the plurality of second electrodes 221, 222, 223, and 224 may be disposed on an upper surface 120a of the second sub-layer 120.

The second sub-layer 120 may include a first side surface S1 and a second side surface S2 facing each other, a third side surface S3 and a fourth side surface S4 facing each other, a first corner region V1 connecting the first side surface S1 to the third side surface S3, a second corner region V2 connecting the side surface S1 to the fourth side surface S4, a third corner region V3 connecting the second side surface S2 to the fourth side surface S4, and a fourth corner region V4 connecting the second side surface S2 to the third side surface S3.

The plurality of second electrodes 221, 222, 223, and 224 may each have surfaces which face the arrangement portion 211 to be parallel thereto. In this case, a first gap d11 between the arrangement portion 211 and each of the plurality of second electrodes 221, 222, 223, and 224 may be in a range of 50 μm to 150 μm. When the first gap d11 is 50 μm or more, insulation between the electrodes may be secured. Alternatively, when the first gap d11 is 150 μm or less, a package size may be reduced.

The second-first electrode 221 and the second-second electrode 222 may be disposed adjacent to the first side surface S1. The second-second electrode 222 and the second-third electrode 223 may be disposed adjacent to the fourth side surface S4. The second-third electrode 223 and the second-fourth electrode 224 may be disposed adjacent to the second side surface S2. The second-fourth electrode 224 and the extension 213 may be disposed adjacent to the third side surface S3.

A width of a first separated portion d1 between the second-second electrode 222 and the second-third electrode 223 and a width of a second separated portion d2 between the second-third electrode 223 and the second-fourth electrode 224 may be varied according to an area of the arrangement portion 211. That is, as the area of the arrangement portion 211 increases, the widths of the first separated portion d1 and the second separated portion d2 may increase. Consequently, the area of the arrangement portion 211 may increase to mount a large-area chip and, at the same time, areas of the second-first to second-fourth electrodes 221, 222, 223, and 224 may decrease to maintain a package size.

The first separated portion d1 between the second-second electrode 222 and the second-third electrode 223 may be disposed between the second corner C2 and the fourth side surface S4. The second separated portion d2 between the second-third electrode 223 and the second-fourth electrode 224 may be disposed between the third corner C3 and the second side surface S2. A third separated portion d3 may be disposed between the extension 213 and the second-fourth electrode 224. A fourth separated portion d4 between the second-first electrode 221 and the second-second electrode 222 may be disposed between the first corner C1 and the first side surface S1.

The arrangement portion 211 is disposed to be rotated in a clockwise or counterclockwise direction around the body 10 such that the widths of the first to fourth separated portions d1, d2, d3, and d4 between the second-first to second-fourth electrodes 221, 222, 223, and 224 may increase so as to not be in contact with the first to third corners C1, C2, and C3.

The width of each of the first separated portion d1 and the second separated portion d2 may be in a range of 50 μm to 250 μm. When the width is 50 μm or more, the area of the arrangement portion 211 may increase such that a large-area chip may be mounted. When the width is 250 μm or less, the areas of the second-first to second-fourth electrodes 221, 222, 223, and 224 may be secured such that wire mounting may be possible.

The body 10 may include first, second, third, and fourth divided areas A1, A2, A3, and A4 which are defined by a first imaginary straight line L1 passing through central portions of the first side surface S1 and the second side surface S2 and a second imaginary straight line L2 passing through central portions of the third side surface S3 and the fourth side surface S4.

The first divided area A1 may include the first corner region V1. The second divided area A2 may include the second corner region V2. The third divided area A3 may include the third corner region V3. The fourth divided area A4 may include the fourth corner region V4.

The extension 213 and the second-first electrode 221 may be disposed in the first divided area A1. The second-second electrode 222 may be disposed in the second divided area A2. The second-third electrode 223 may be disposed in the third divided area A3. The second-fourth electrode 224 may be disposed in the fourth divided area A4.

The arrangement portion 211 may include a point at which the first imaginary straight line L1 intersects with the second imaginary straight line L2. The arrangement portion 211 may be disposed above the first divided area A1 to the fourth divided area A4.

Figure 5:
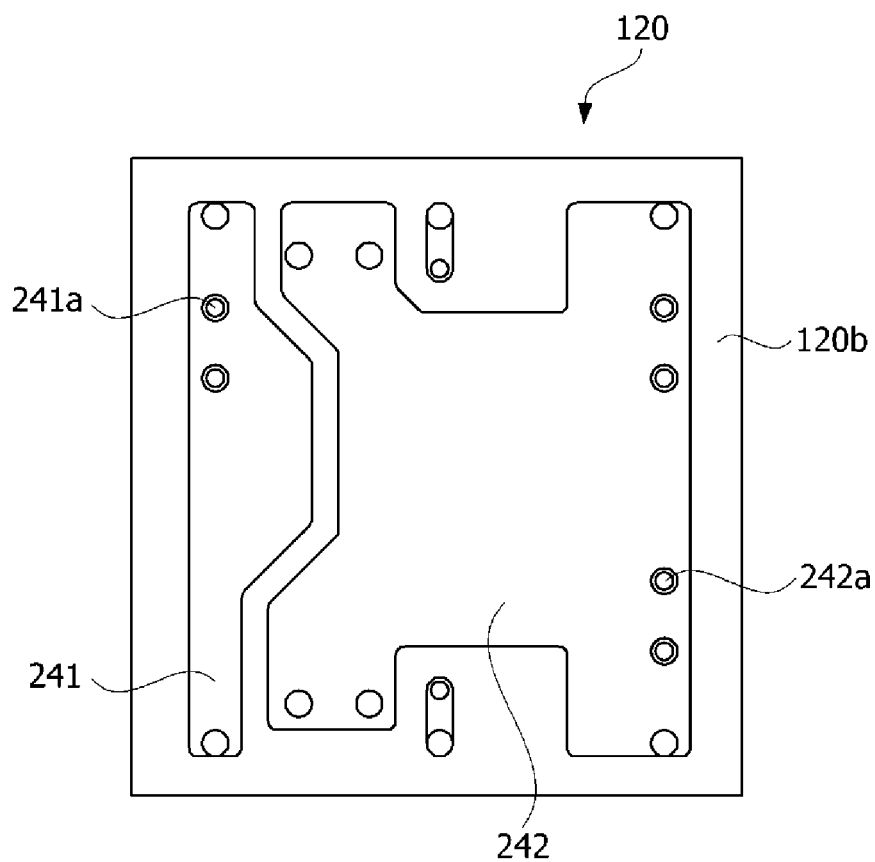
FIG. 5 is a diagram illustrating a connection electrode.
Figure 6:
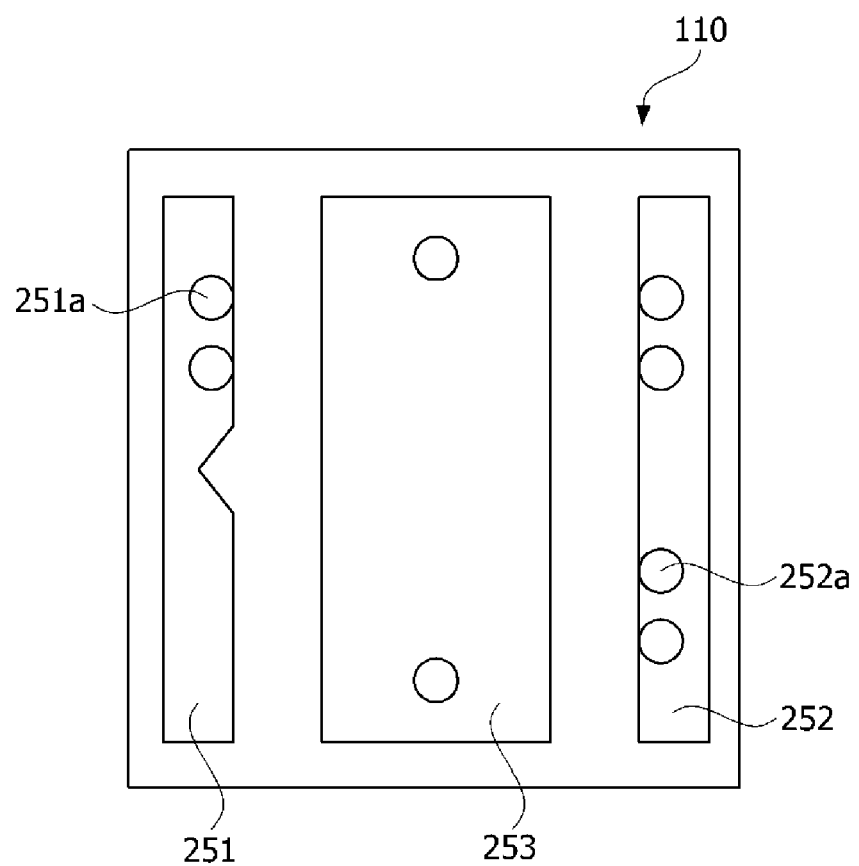
FIG. 6 is a diagram illustrating a first electrode pad and a second electrode pad.
Figure 7:
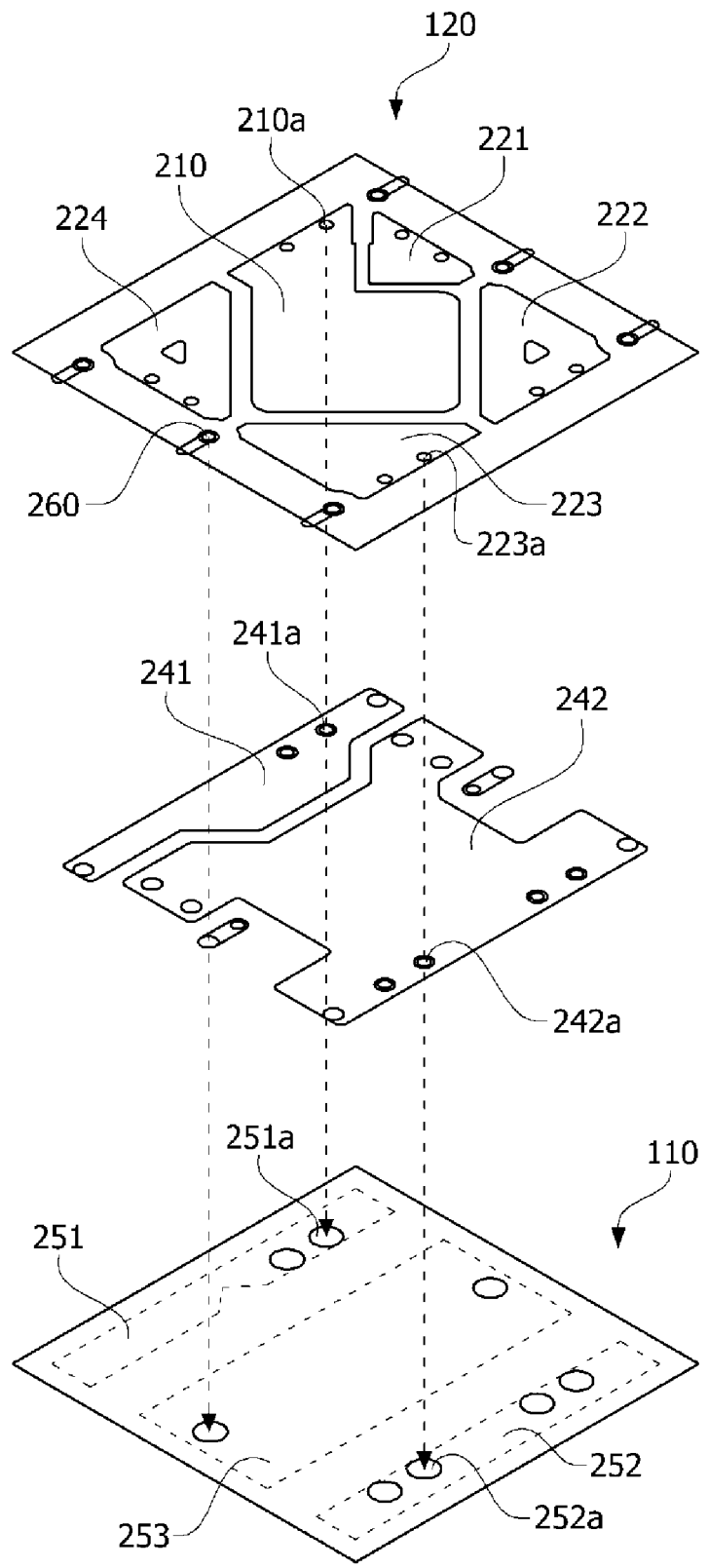
FIG. 7 is a diagram illustrating the electrode pattern layer and a structure in which the connection electrode is electrically connected to the electrode pads.

FIG. 5 is a diagram illustrating a connection electrode, FIG. 6 is a diagram illustrating a first electrode pad and a second electrode pad, and FIG. 7 is a diagram illustrating the electrode pattern layer and a structure in which the connection electrode is electrically connected to the electrode pads.

Referring to FIG. 5, a first connection electrode 241 and a second connection electrode 242 may be disposed on a lower surface 120b of the second sub-layer 120.

That is, the first electrode 210 and the plurality of second electrodes 221, 222, 223, and 224 may be disposed on the upper surface 120a of the second sub-layer 120, and the first connection electrode 241 and the second connection electrode 242 may be disposed on the lower surface 120b of the second sub-layer 120.

The first sub-layer 110 may be bonded to the second sub-layer 120 through the first connection electrode 241 and the second connection electrode 242. This is because, when the first sub-layer 110 and the second sub-layer 120 are each made of an insulating material such as AlN, the first sub-layer 110 may be difficult to be directly bonded to the second sub-layer 120. Accordingly, the first connection electrode 241 and the second connection electrode 242 may serve not only to electrically connect the first sub-layer 110 to the second sub-layer 120 but also as an electrical connection path.

Referring to FIG. 6, a first electrode pad 251, a second electrode pad 252, and a heat dissipation pad 253 may be disposed on a lower surface of the first sub-layer 110.

The heat dissipation pad 253 may be disposed between the first electrode pad 251 and the second electrode pad 252.

The heat dissipation pad 253 may be larger than the first electrode pad 251 and the second electrode pad 252 for heat dissipation, but the present invention is not limited thereto.

Referring to FIG. 7, the first connection electrode 241 may electrically connect the first electrode 210 to the first electrode pad 251. In this case, a first through electrode (not shown) may be disposed in a first through-hole 210a of the first electrode 210, a second through-hole 241a of the first connection electrode 241, and a third through-hole 251a of the first electrode pad 251, thereby electrically connecting the first electrode 210, the first connection electrode 241, and the first electrode pad 251.

The second connection electrode 242 may electrically connect the second-first to second-fourth electrodes 221, 222, 223, and 224 to the second electrode pad 252. For example, a second through electrode (not shown) may be disposed in a fourth through-hole 223a of the second-third electrode 223, a fifth through-hole 242a of the second connection electrode 242, and a sixth through-hole 252a of the second electrode pad 252, thereby electrically connecting the second-third electrode 223, the second connection electrode 242, and the second electrode pad 252. With the same manner, the remaining electrodes 221, 222, and 224 of the plurality of second electrodes may be electrically connected to the second electrode pad 252. That is, the second connection electrode 242 may be disposed so as to overlap the second-first to second-fourth electrodes 221, 222, 223, and 224.

A third through electrode 260 may connect the first sub-layer 110 and the second sub-layer 120 to the heat dissipation pad 253, thereby improving performance of heat dissipation.

The heat dissipation pad 253 may not be directly connected to the first electrode 210 and may transfer heat which flows in the first sub-layer 110 and the second sub-layer 120. When the heat dissipation pad 253 is electrically connected to the first electrode 210, the heat dissipation pad 253 may be polarized. Therefore, it may be disadvantageous in terms of heat transfer and reliability.

The first electrode 210, the plurality of second electrodes 221, 222, 223, and 224, the first electrode pad 251, the second electrode pad 252, and the heat dissipation pad 253 may each have a structure in which a plurality of metal layers are stacked. For example, a W/Ni/Pd/Au structure may be employed. In this case, a thickness of W may be in a range of 5 µm to 15 µm, a thickness of Ni may be in a range of 4 µm to 6 µm, a thickness of Pd may be in a range of 0.05 µm to 0.15 µm, and a thickness of Au may be in a range of 0.4 µm to 0.6 µm, but the present invention is not limited thereto. Since a bonding of the first sub-layer 110 to the second sub-layer 120 is one of the main purposes of the first connection electrode 241 and the second connection electrode 242, each of the first connection electrode 241 and the second connection electrode 242 may be formed as a single W layer having a thickness in a range of 5 µm to 15 µm.

Figure 8:
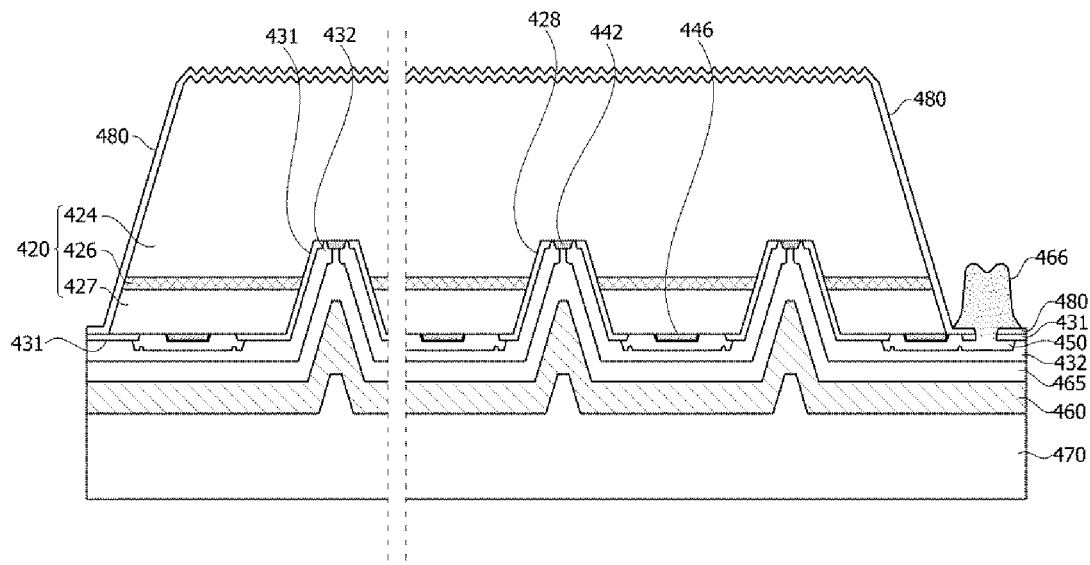
FIG. 8 is a conceptual diagram of a first light-emitting device of FIG. 1.

FIG. 8 is a conceptual diagram of a first light-emitting device of FIG. 1.

Referring to FIG. 8, the first light-emitting device 20 may include a light-emitting structure 420, first electrodes 442 and 465 electrically connected to a first conductive-type semiconductor layer 424 of the light-emitting structure 420, and second electrodes 446 and 450 electrically connected to a second conductive-type semiconductor layer 427 of the light-emitting structure 420.

The light-emitting structure 420 may include the first conductive-type semiconductor layer 424, the second conductive-type semiconductor layer 427, and an active layer 426 disposed between the first conductive-type semiconductor layer 424 and the second conductive-type semiconductor layer 427.

The first conductive-type semiconductor layer 424 may be formed of a Group III-V or II-VI compound semiconductor and doped with a first conductive dopant. For example, the first conductive-type semiconductor layer 424 may be selected from among GaN, AlGaN, InGaN, InAlGaN, and the like which are semiconductor materials having a composition formula of $In_{x1}Al_{y1}Ga_{1-x1-y1}N$ ($0 \leq x1 \leq 1$, $0 \leq y1 \leq 1$, and $0 \leq x1+y1 \leq 1$). Further, the first dopant may be an n-type dopant such as Si, Ge, Sn, Se, or Te. When the first dopant is an n-type dopant, the first conductive-type semiconductor layer 424 doped with the first dopant may be an n-type semiconductor layer.

The active layer 426 is disposed between the first conductive-type semiconductor layer 424 and the second conductive-type semiconductor layer 427. The active layer 426 is a layer in which electrons (or holes) implanted through the first conductive-type semiconductor layer 424 and holes (or electrons) implanted through the second conductive-type semiconductor layer 427 are recombined. The active layer 426 may be transitioned at a low energy level due to the recombination of electrons and holes and emit light having a UV wavelength.

The active layer 426 may have any one of a single well structure, a multi-well structure, a single quantum well structure, a multi quantum well (MQW) structure, a quantum dot structure, or a quantum wire structure, but the structure of the active layer 426 is not limited thereto.

The second conductive-type semiconductor layer 427 may be formed on the active layer 426, formed of a Group III-V or II-VI compound semiconductor, and doped with a second dopant. The second conductive-type semiconductor layer 427 may be formed of a semiconductor material having a composition formula of $In_{x5}Al_{y2}Ga_{1-x5-y2}N$ ($0 \leq x5 \leq 1$, $0 \leq y2 \leq 1$, and $0 \leq x5+y2 \leq 1$) or a material selected from among AlInN, AlGaAs, GaP, GaAs, GaAsP, and AlGaInP. When the second dopant is a p-type dopant such as Mg, Zn, Ca, Sr, or Ba, the second conductive-type semiconductor layer 427 doped with the second dopant may be a p-type semiconductor layer.

The light-emitting structure 420 may include a plurality of recesses 428.

A plurality of recesses 428 may be disposed in a portion of the first conductive-type semiconductor layer 424 by passing through the active layer 426 from a lower surface of the second conductive-type semiconductor layer 427. A first insulating layer 431 may be disposed in the recess 428 to electrically insulate the first conductive layer 465 from the second conductive-type semiconductor layer 427 and the active layer 426.

The first electrodes 442 and 465 may include a first contact electrode 442 and a first conductive layer 465. The first contact electrode 442 may be disposed on an upper surface of the recess 428 to be electrically connected to the first conductive-type semiconductor layer 424.

When an aluminum composition of the light-emitting structure 420 increases, a current distribution characteristic inside the light-emitting structure 420 may be degraded. Further, from the active layer 426, a quantity of emission light is increased to a lateral surface (a transverse magnetic (TM) mode) more than to a GaN-based blue light-emitting device. This TM mode may mainly occur in an ultraviolet light-emitting device.

The ultraviolet light-emitting device has a lower current distribution characteristic than the GaN-based blue light-emitting device. Therefore, a relatively large number of first contact electrodes 442 needs to be disposed in the ultraviolet light-emitting device as compared with the GaN-based blue light-emitting device.

A second electrode pad 466 may be disposed at an edge of one side of the ultraviolet light-emitting device.

The first insulating layer 431 is partially open at a lower portion of the second electrode pad 466 such that the second conductive layer 450 may be electrically connected to the second contact electrode 446.

A passivation layer 480 may be formed on an upper surface and a side surface of the light-emitting structure 420. The passivation layer 480 may be a region adjacent to the second contact electrode 446 and may be in contact with the first insulating layer 431 below the second electrode 446.

The first insulating layer 431 may electrically insulate the first contact electrode 442 from the active layer 426 and the second conductive-type semiconductor layer 427. Further, the first insulating layer 431 may electrically insulate the second conductive layer 450 from the first conductive layer 465.

The first insulating layer 431 may be formed of at least one selected from the group consisting of $SiO_2$, $Si_3O_y$, $Si_3N_4$, $Si_xN_y$, $SiO_xN_y$, $Al_2O_3$, $TiO_2$, AlN, and the like, but the present invention is not necessarily limited thereto. The first insulating layer 431 may be formed of a single layer or a multiple layer. For example, the first insulating layer 431 may be a distributed Bragg reflector (DBR) having a multilayered structure including an Si oxide or a Ti compound. However, the present invention is not limited thereto, and the first insulating layer 431 may include various reflective structures.

When the first insulating layer 431 performs a function of reflecting light, light emitted from the active layer 426 toward a side surface of thereof may be reflected upward to improve light extraction efficiency. As the number of the recesses 428 increases, the light extraction efficiency of the ultraviolet light-emitting device may be effective more than a light-emitting device which emits blue light.

The second electrodes 446 and 450 may include a second contact electrode 446 and a second conductive layer 450.

The second contact electrode 446 may be in contact with the lower surface of the second conductive-type semiconductor layer 427. The second contact electrode 446 may include a conductive oxide electrode having relatively low ultraviolet light absorption. For example, the conductive oxide electrode may be indium tin oxide (ITO), but the present invention is not necessarily limited thereto.

The second conductive layer 450 may inject a current into the second conductive-type semiconductor layer 427. Further, the second conductive layer 450 may reflect light emitted from the active layer 426.

The second conductive layer 450 may cover the second contact electrode 446. Thus, the second electrode pad 466, the second conductive layer 450, and the second contact electrode 446 may form a single electrical channel.

The second conductive layer 450 may surround the second contact electrode 446 and may be in contact with a side surface and a lower surface of the first insulating layer 431. The second conductive layer 450 may be formed of a material having high adhesive strength with respect to the first insulating layer 431, formed of at least one material selected from the group consisting of Cr, Al, Ti, Ni, Au, and an alloy thereof, and formed of a single layer or a plurality of layers.

When the second conductive layer 450 is in contact with the side surface and the lower surface of the first insulating layer 431, thermal and electrical reliability of the second contact electrode 446 may be improved. Further, the second conductive layer 450 may have a function of reflecting the light emitted between the first insulating layer 431 and the second contact electrode 446 in an upward direction.

The second insulating layer 432 may electrically insulate the second conductive layer 450 from the first conductive layer 465. The first conductive layer 465 may be electrically connected to the first contact electrode 442 by passing through the second insulating layer 432.

The first conductive layer 465 and a bonding layer 460 may be disposed along a lower surface of the light-emitting structure 420 and topography of the recess 428. The first conductive layer 465 may be formed of a material having high reflectance. For example, the first conductive layer 465 may include aluminum. When the first conductive layer 465 includes Al, the first conductive layer 465 serves to reflect the light emitted from the active layer 426 in the upward direction such that light extraction efficiency may be improved.

The bonding layer 460 may include a conductive material. For example, the bonding layer 460 may include a material selected from the group consisting of gold, tin, indium, aluminum, silicon, silver, nickel, and copper Cu, or an alloy thereof.

A conductive substrate 470 may be made of a conductive material so as to inject a current into the first conductive-type semiconductor layer 424. For example, the conductive substrate 470 may include a metal or a semiconductor material. The conductive substrate 470 may be a metal having high electrical conductivity and/or high thermal conductivity. In this case, heat generated during an operation of the semiconductor device may be rapidly transferred to the outside.

The conductive substrate 470 may include a material selected from the group consisting of silicon, molybdenum, tungsten, copper, and aluminum, or an alloy thereof.

Irregularities may be formed on an upper surface of the light-emitting structure 420. The irregularities may improve extraction efficiency of the light emitted from the light-emitting structure 420. The irregularities may have different average heights according to a UV wavelength, and, in the case of UV-C, when a height of each of the irregularities is in a range of 300 nm to 800 nm and an average height of each thereof is in a range of 500 nm to 600 nm, light extraction efficiency may be improved.

Although the first light-emitting device 20 has been described as having a vertical structure, the present invention is not necessarily limited thereto, and the first light-emitting device 20 may have a flip chip structure or a horizontal structure. Similarly, the second light-emitting device 30 and the protective element 40 may each have a flip chip structure, a vertical structure, or a horizontal structure.

Figure 9:
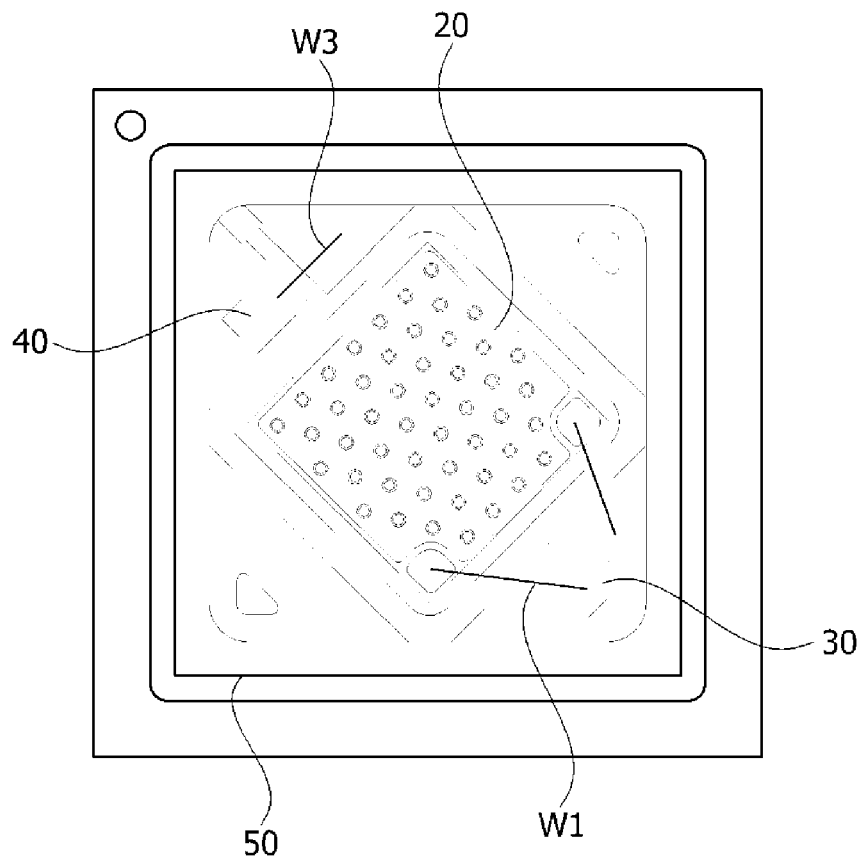
FIG. 9 is a modified example of FIG. 3.

FIG. 9 is a modified embodiment of FIG. 3.

Referring to FIG. 9, a second light-emitting device 30 may be electrically connected to a first light-emitting device 20 through a first wire W1. That is, the first light-emitting device 20 and the second light-emitting device 30 may be connected in a chip-to-chip manner. Alternatively, the second light-emitting device 30 may be electrically connected to a protective element 40 via a third wire W3.

Figure 10:
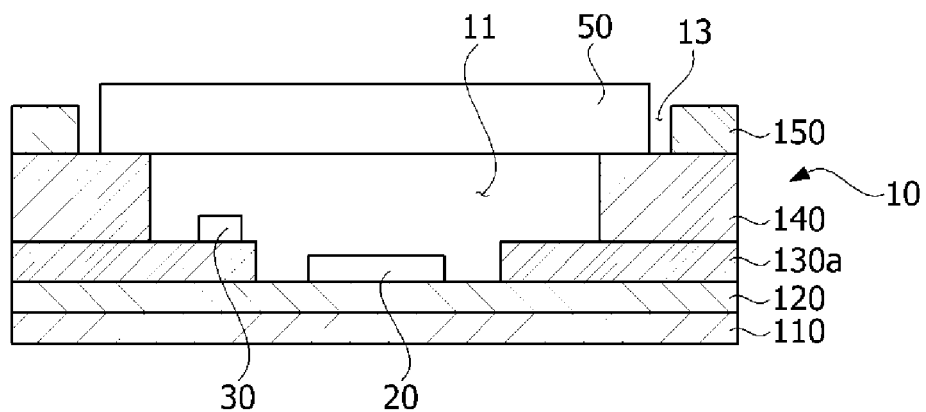
FIGS. 10 and 11 are a modified example of FIG. 2.
Figure 11:
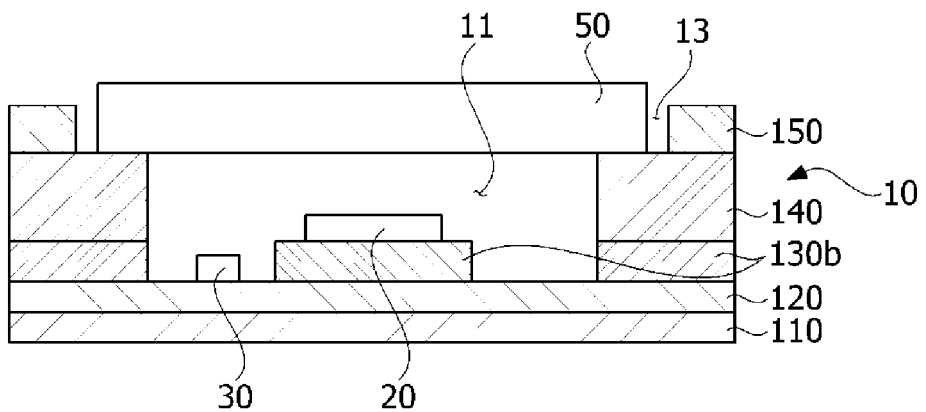

FIGS. 10 and 11 are a modified example of FIG. 2.

Referring to FIG. 10, a body 10 may include a plurality of sub-layers 110, 120, 130a, 140, and 150.

The plurality of sub-layers 110, 120, 130a, 140 and 150 may include a first sub-layer 110, a second sub-layer 120 disposed on the first sub-layer 110, a third-first sub-layer 130a disposed on the second sub-layer 120, a fourth sub-layer 140 disposed on the third-first sub-layer 130a, and a fifth sub-layer 150 disposed on the fourth sub-layer 140.

The second sub-layer 120 and the third-first sub-layer 130a may include a bottom surface of a cavity 11.

The plurality of sub-layers 110, 120, 130a, 140, and 150 may be fixed by an adhesive (not shown). The plurality of sub-layers 110, 120, 130a, 140, and 150 may be made of the same material or different materials. For example, the plurality of sub-layers 110, 120, 130a, 140, and 150 may include a ceramic material such as AlN, but the present invention is not necessarily limited thereto.

A first light-emitting device 20 may be disposed on the second sub-layer 120, and a second light-emitting device 30 may be disposed on the third-first sub-layer 130a. As a result, light emitted from the first light-emitting device 20 is prevented from being absorbed by the second light-emitting device 30 such that light extraction efficiency may be improved. For example, referring to FIGS. 2 and 10, the first electrode 210 and the second-first electrode 221 may be disposed on the second sub-layer 120, and the second-second electrode 222, the second-third electrode 223, and the second-fourth electrode 224 may be disposed on the third-first sub-layer 130a.

Referring to FIG. 11, a body 10 may include a plurality of sub-layers 110, 120, 130b, 140, and 150.

The plurality of sub-layers 110, 120, 130b, 140, and 150 may include a first sub-layer 110, a second sub-layer 120 disposed on the first sub-layer 110, a third-second sub-layer 130b disposed on the second sub-layer 120, a fourth sub-layer 140 disposed on the third-second sub-layer 130b, and a fifth sub-layer 150 disposed on the fourth sub-layer 140.

The second sub-layer 120 and the third-second sub-layer 130b may include a bottom surface of a cavity 11.

The plurality of sub-layers 110, 120, 130b, 140, and 150 may be fixed by an adhesive (not shown). The plurality of sub-layers 110, 130b, 120, 140, 150 may be the same material or may be different materials. For example, the plurality of sub-layers 110, 120, 130b, 140, and 150 may include a ceramic material such as AlN, but the present invention is not necessarily limited thereto.

A first light-emitting device 20 may be disposed on the third-second sub-layer 130b, and a second light-emitting device 30 may be disposed on the second sub-layer 120. As a result, light emitted from the first light-emitting device 20 is prevented from being absorbed by the second light-emitting device 30 such that light extraction efficiency may be improved. For example, referring to FIGS. 2 and 11, the first electrode 210 and the second-first electrode 221 may be disposed on the third-second sub-layer 130b, and the second-second electrode 222, the second-third electrode 223, and the second-fourth electrode 224 may be disposed on the second sub-layer 120.

Referring to FIGS. 10 and 11, a height from a lower surface of the first sub-layer 110 to an upper surface of the second sub-layer 120 may be in a range of 0.22 mm to 0.38 mm. A thickness of the first sub-layer 110 may be equal to that of the second sub-layer 120, but the present invention is not necessarily limited thereto. A thickness of the third-first sub-layer 130a or the third-second sub-layer 130b may be in a range of 0.15 mm to 0.25 mm. A thickness of the fourth sub-layer 140 may be in a range of 0.35 mm to 0.45 mm. A thickness of the fifth sub-layer 150 may be in a range of 0.15 mm to 0.25 mm. A height from the lower surface of the first sub-layer 110 to an upper surface of the fifth sub-layer 150 may be in a range of 0.99 mm to 1.21 mm.

In accordance with the exemplary embodiments of the present invention, visual inspection can determine whether ultraviolet light is emitted from a first light-emitting device according to whether visible light is emitted from a second light-emitting device.

Further, the first light-emitting device may be disposed to be inclined with respect to an edge of a bottom surface of a cavity such that a chip size can be manufactured to be increased in one size package.

Various beneficial advantages and effects of the present invention are not limited to the above description and should be easily understood through a description of a detailed embodiment of the present invention.

While the present invention has been mainly described with reference to the exemplary embodiments, it should be understood that the present invention is not limited to the disclosed exemplary embodiments, and various modifications and applications can be devised by those skilled in the art to which the present invention pertains without departing from the gist of the present invention. For example, each component specifically shown in the exemplary embodiments can be modified and implemented. It should be construed that differences related to these modifications and applications will fall within the scope of the present invention defined by the appended claims.

It will be understood that when an element or layer is referred to as being "on" another element or layer, the element or layer can be directly on another element or layer or intervening elements or layers. In contrast, when an element is referred to as being "directly on" another element or layer, there are no intervening elements or layers present. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section could be termed a second element, component, region, layer or section without departing from the teachings of the present invention.

Spatially relative terms, such as "lower", "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "lower" relative to other elements or features would then be oriented "upper" relative to the other elements or features. Thus, the exemplary term "lower" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the disclosure are described herein with reference to cross-section illustrations that are schematic illustrations of idealized embodiments (and intermediate structures) of the disclosure. As such, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light-emitting device package comprising:
a body including a cavity; a first electrode disposed on a bottom surface of the cavity; a plurality of second electrodes disposed on the bottom surface of the cavity and configured to surround the first electrode; a first light-emitting device disposed on the first electrode; a second light-emitting device disposed on one among the plurality of second electrodes; and a light-transmitting member disposed on the body, wherein the bottom surface of the cavity includes a first edge extending in a first direction, a second edge configured to face the first edge and extend in the first direction, a third edge configured to extend in a second direction perpendicular to the first direction and connected to the first and second edges, and a fourth edge configured to face the third edge, extend in the second direction, and connected to the first and second edges, the first electrode includes an arrangement portion, on which the first light-emitting device is disposed and which is vertically overlapped with the first light-emitting device, and an extension portion configured to extend from the arrangement portion to the third edge, the arrangement portion includes a first inclined surface, a second inclined surface configured to face the first inclined surface, a third inclined surface perpendicular to the first and second inclined surfaces, a fourth inclined surface configured to face the third inclined surface, a first corner at which the first inclined surface and the fourth inclined surface meet, a second corner at which the second inclined surface and the fourth inclined surface meet, and a third corner at which the second inclined surface and the third inclined surface meet, each of the first to fourth inclined surfaces has an angle greater than 0 degree or less than 90 degrees with respect to the first to fourth edges, and the plurality of second electrodes branch off by the first to third corners, wherein each of the plurality of second electrodes has a separate corresponding surface facing a separate corresponding one of the first inclined surface, the second inclined surface, the third inclined surface and the fourth inclined surface, wherein each of an angle between an extension line of the first inclined surface and the first edge, an angle between an extension line of the second inclined surface and the second edge, an angle between an extension line of the third inclined surface and the third edge, and an angle between an extension line of the fourth inclined surface and the fourth edge is greater than 30 degrees or less than 60 degrees.

2. The light-emitting device package of claim 1, wherein the first light-emitting device emits light having a peak wavelength in an ultraviolet light wavelength range.

3. The light-emitting device package of claim 1, wherein the second light-emitting device emits light having a peak wavelength in a visible light wavelength range.

4. The light-emitting device package of claim 1, wherein:
the first corner faces a central portion of the first edge;
the second corner faces a central portion of the fourth edge; and
the third corner faces a central portion of the second edge.

5. The light-emitting device package of claim 1, further comprising a protective element disposed on the extension portion.

6. The light-emitting device package of claim 5, wherein the first light-emitting device and the second light-emitting device emit light simultaneously.

7. The light-emitting device package of claim 5, wherein the extension portion is connected to the first inclined surface and the third inclined surface.

8. The light-emitting device package of claim 5, wherein the plurality of second electrodes are disposed to be spaced apart from each other.

9. The light-emitting device package of claim 5, wherein the plurality of second electrodes include:
- a second-first electrode configured to face the first inclined surface and the extension portion and extend to the first edge;
- a second-second electrode configured to face the fourth inclined surface and extend to the first and fourth edges;
- a second-third electrode configured to face the second inclined surface and extend to the second and fourth edges facing; and
- a second-fourth electrode configured to face the third inclined surface and extend to the second and third edges,
- wherein the protective element is connected to the second-first electrode through a third wire.

* * * * *